United States Patent
Manikonda et al.

(10) Patent No.: US 10,699,200 B2
(45) Date of Patent: *Jun. 30, 2020

(54) AUTONOMOUS LEARNING OF ACTIONABLE MODELS FROM UNSTRUCTURED DATA

(71) Applicant: International Business Machines Corporation, Armonk, NY (US)

(72) Inventors: Lydia Manikonda, Tempe, AZ (US); Anton Viktorovich Riabov, Ann Arbor, MI (US); Shirin Sohrabi Araghi, Port Chester, NY (US); Biplav Srivastava, Rye, NY (US); Kartik Talamadupula, White Plains, NY (US); Deepak Srinivas Turaga, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 116 days.

This patent is subject to a terminal disclaimer.

(21) Appl. No.: 15/840,548

(22) Filed: Dec. 13, 2017

(65) Prior Publication Data
US 2018/0218272 A1   Aug. 2, 2018

Related U.S. Application Data

(63) Continuation of application No. 15/420,433, filed on Jan. 31, 2017.

(51) Int. Cl.
*G06N 5/04* (2006.01)
*G06F 30/20* (2020.01)
(Continued)

(52) U.S. Cl.
CPC ............... *G06N 5/04* (2013.01); *G06F 30/20* (2020.01); *G06F 40/289* (2020.01); *G06F 40/35* (2020.01)

(58) Field of Classification Search
CPC ........... G06N 5/04; G06F 30/20; G06F 40/35; G06F 40/289
See application file for complete search history.

(56) References Cited

U.S. PATENT DOCUMENTS

| 2014/0358828 A1 | 12/2014 | Phillipps et al. |
| 2015/0339580 A1 | 11/2015 | Riabov et al. |

(Continued)

OTHER PUBLICATIONS

"WordNet Interface." NKLT Project. http://www.nltk.org/howto/wordnet.html. Last Accessed Dec. 18, 2018. 6 pages.

(Continued)

*Primary Examiner* — Eric Nilsson
(74) *Attorney, Agent, or Firm* — Amin, Turocy & Watson, LLP

(57) ABSTRACT

Techniques for autonomously generating a domain model and/or an action model based on unstructured data are provided. In one example, a computer implemented method can comprise extracting, by a system operatively coupled to a processor, a plurality of actions from a non-numerical language. The plurality of actions can achieve a goal. The computer-implemented method can also comprise generating, by the system, a domain model based on the plurality of actions. Further, the computer-implemented method can comprise generating, by the system, an action model based on the domain model. In various embodiments, the action model can comprise an action transition for accomplishing the goal.

12 Claims, 10 Drawing Sheets

(51) Int. Cl.
G06F 40/35 (2020.01)
G06F 40/289 (2020.01)

(56) References Cited

U.S. PATENT DOCUMENTS

2016/0171063 A1 6/2016 Kiciman et al.
2017/0091859 A1* 3/2017 Mohammad ............ G06Q 40/02

OTHER PUBLICATIONS

"Golder, Scott A., et al.""Diurnal and Seasonal Mood Vary with Work, Sleep, and DaylengthAcross Diverse Cultures." Science 333(6051), Sep. 30, 2011. 5 pages.
Sablon, Gunther, et al. "Using the event calculus to integrate planning and learning in an intelligent autonomous agent." Current Trends in AI Planning, pp. 254-265, 1994, Workshop on Planning Current Trends in AI Planning, Linköping, Sweden, Dec. 1993. 13 pages.
"Configuring PRAW." PRAW. https://praw.readthedocs.io/en/latest/getting_started/configuration.html. Last Accessed Dec. 18, 2018. 5 pages.
Jan. 31, 2017, U.S. Appl. No. 15/420,433.
Arora, et al. A Review on Learning Planning Action Models for Socio-Communicative HRI, Workshop on Affect, Compagnon Artificiel and Interaction, Jun. 2016, Brest, France.
Yang, et al. Learning Action Models from Plan Examples using Weighted MAX-SAT, Artificial Intelligence, vol. 171, Issues 2-3, Feb. 2007, pp. 107-143.
Zhuo, et al. Cross-Domain Action-Model Acquisition for Planning Via Web Search, Proceedings of the Twenty-First International Conference on Automated Planning and Scheduling, 2011, Last accessed Oct. 12, 2016, pp. 298-305.
Byrce, et al. Maintaining Evolving Domain Models, Proceedings of the Twenty-Fifth International Joint Conference on Artificial Intelligence, Last accessed Jan. 23, 2017, pp. 3053-3059.
De Choudhury, et al. Predicting Postpartum Changes in Emotion and Behavior via Social Media, Last accessed Jan. 23, 2017, 10 Pages.
Gil, Learning by Experimentation: Incremental Refinement of Incomplete Planning Domains, Last accessed Jan. 23, 2017, 9 Pages.
Anonymous, Generating actions based on integration of information from social media and time management applications, Feb. 25, 2015, 2 Pages.
Kambhampati, Model-lite Planning for the Web Age Masses:The Challenges of Planning with Incomplete and Evolving Domain Models, Last accessed Jan. 23, 2017, 4 Pages.
Kiciman, et al. Towards Decision Support and Goal Achievement: Identifying Action-Outcome Relationships From Social Media, Last accessed Jan. 23, 2017, pp. 547-556.
Law, et al. Towards Large-Scale Collaborative Planning: Answering High-Level Search Queries Using Human Computation, Last accessed Jan. 23, 2017, 6 Pages.
Manikonda, et al. AI-MIX: Using Automated Planning to Steer Human Workers Towards Better Crowdsourced Plans, Proceedings of the Twenty-Sixth Annual Conference on Innovative Applications of Artificial Intelligence, Last accessed Jan. 23, 2017, pp. 3004-3009.
Musie, Planning.Domains, Last accessed Jan. 23, 2017, 54 Pages.
Oates, et al. Learning Planning Operators with Conditional and Probabilistic Effects, AAAI Technical Report SS-96-04, Last accessed Jan. 23, 2017, pp. 86-94.
Paul, et al. You Are What You Tweet: Analyzing Twitter for Public Health, Proceedings of the Fifth International AAAI Conference on Weblogs and Social Media, Last accessed Jan. 23, 2017, pp. 265-272.
Sarker, et al. Utilizing social media data for pharmacovigilance: A review, Journal of Biomedical Informatics 54 (2015) 202-212, Feb. 23, 2015, pp. 202-212.
Simpson, et al. Planning domain definition using GIPO, Knowledge Engineering Review, vol. 22:2, Last accessed Jan. 23, 2017, pp. 117-134, United Kingdom.
Sohrabi, et al. Hypothesis Exploration for Malware Detection using Planning, Proceedings of the Twenty-Seventh AAAI Conference on Artificial Intelligence, Last accessed Jan. 23, 2017, pp. 883-889.
Riabov, et al. Planning-Based Reasoning for Automated Large-Scale Data Analysis, Proceedings of the Twenty-Fifth International Conference on Automated Planning and Scheduling, Last accessed Jan. 23, 2017, pp. 282-290.
Tate, et al. O-Plan 2: an Open Architecture for Command, Planning and Control, Last accessed Jan. 23, 2017, pp. 1-26.
Tian, et al. Discovering Underlying Plans Based on Distributed Representations of Actions, Proceedings of the 15th International Conference on Autonomous Agents and Multiagent Systems (AAMAS 2016), Last accessed Jan. 23, 2017, 9 Pages, Singapore.
Toutanova et al. Feature-Rich Part-of-Speech Tagging with a Cyclic Dependency Network, Last accessed Jan. 23, 2017, 8 Pages.
Vaquero, et al. itSIMPLE 2.0: An Integrated Tool for Designing Planning Domains. Last accessed Jan. 23, 2017, 5 Pages.
Wilkins, Can AI Planners Solve Practical Problems?, Computational Intelligence Journal, Last accessed Jan. 23, 2017, 32 Pages.
Yoon, et al. Towards Model-lite Planning: A Proposal For Learning & Planning with Incomplete Domain Models, Last accessed Jan. 23, 2017, 6 Pages.
Zhuo et al. Learning complex action models with quantifiers and logical implications, Artificial Intelligence 174, Sep. 29, 2010, Last accessed Jan. 23, 2017, pp. 1540-1569.
Zhuo et al. Refining Incomplete Planning Domain Models Through Plan Traces, Last accessed Jan. 23, 2017, 7 Pages.
Han, et al. Data Mining Concepts and Techniques, Last accessed Jan. 21, 2017, 740 Pages.
Ghallab, et al. Automated Planning Theory and Practice, Last accessed Jan. 21, 2017, pp. 1-300.
Ghallab, et al. Automated Planning Theory and Practice, Last accessed Jan. 21, 2017, pp. 301-638.
Wang, Learning by Observation and Practice: An Incremental Approach for Planning Operator Acquisition, In Proceedings of the 12th International Conference on Machine Learning, 1995, Last accessed Jan. 27, 2017, 9 Pages.
Non-Final Office Action received for U.S. Appl. No. 15/420,433 dated Oct. 30, 2019, 27 pages.

* cited by examiner

| SEQUENCE PROBABILITY THRESHOLD 502 | CLUSTER THRESHOLD 402 | FIRST ACTION MODEL 404 EXPLAINABILITY VALUE | SECOND ACTION MODEL 406 EXPLAINABILITY VALUE | THIRD ACTION MODEL 408 EXPLAINABILITY VALUE |
|---|---|---|---|---|
| 0 | 2.25 | 65.5 (62.03) | 64.5 (60.5) | 73.4 (67.2) |
| 0.001 | 2.25 | 65.0 (62.0) | 64.0 (60.5) | 71.4 (65.9) |
| 0.01 | 2.25 | 47.5 (46.8) | 49.0 (45.0) | 47.1 (45.0) |
| 0 | 1.75 | 69.3 (66.8) | 70.7 (67.0) | 78.4 (73.0) |
| 0.001 | 1.75 | 68.7 (66.5) | 69.8 (67.0) | 76.3 (71.6) |
| 0.01 | 1.75 | 51.1 (51.4) | 55.4 (53.3) | 54.2 (51.5) |
| 0 | 1.25 | 90.4 (88.2) | 89.4 (86.8) | 91.7 (88.8) |
| 0.001 | 1.25 | 89.0 (87.9) | 88.6 (86.8) | 89.3 (87.3) |
| 0.01 | 1.25 | 76.4 (75.3) | 77.5 (76.7) | 73.0 (71.1) |

| FIRST ACTION MODEL 404 |
|---|
| $P_1$. accept_coldturkey → follow_day → quit_smoke<br>$P_2$. cough_hell → thought_smoke → desire_free → quit_smoke<br>$P_3$. revisit_subreddit → crave_cigarette → quit_smoke |
| SECOND ACTION MODEL 406 |
| $P_4$. recommend_c25k → sign_race → run_minutes<br>$P_5$. suffer_knee → feel_good → run_minutes<br>$P_6$. map_course → gotten_new → run_minutes |
| THIRD ACTION MODEL 408 |
| $P_7$. gloss_cardstock → frame_picture → state_time → gotten_quote<br>$P_8$. dispatch_email → pick_dress → gotten_quote<br>$P_9$. reclaim_summer → wear_dress → gotten_quote |

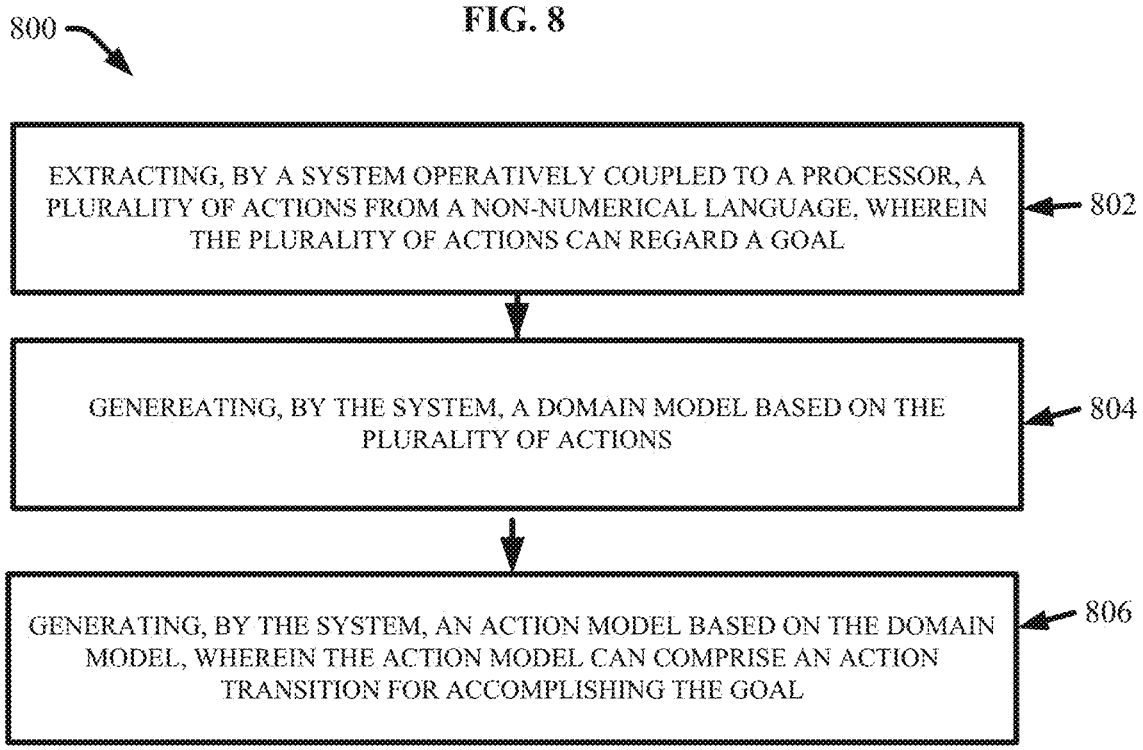

- 902 — EXTRACTING, BY A SYSTEM OPERATIVELY COUPLED TO A PROCESSOR, A PLURALITY OF ACTIONS FROM UNSTRUCTURED DATA PRESENTED IN A NON-NUMERICAL LANGUAGE, WHEREIN THE PLURALITY OF ACTIONS CAN REGARD A GOAL, AND WHEREIN THE NON-NUMERICAL LANGUAGE CAN BE A TEXT (E.G. PRESENTED IN ENGLISH) SHARED OVER A GLOBAL CORPUS (E.G. THE INTERNET) THAT CAN BE GENERATED BY A PLURALITY OF ENTITIES

- 904 — GENEREATING, BY THE SYSTEM, A DOMAIN MODEL BASED ON THE PLURALITY OF ACTIONS, WHEREIN ONE OR MORE ACTIONS FROM THE PLURALITY OF ACTIONS CAN BE GROUPED INTO A CLUSTER BASED ON SIMILARITY OF THE ONE OR MORE ACTIONS

- 906 — IDENTIFYING, BY THE SYSTEM, AN ACTION WITHIN THE CLUSTER AS A CLUSTER REPRESENTATIVE, WHEREIN THE DOMAIN MODEL CAN COMPRISE A PLURALITY OF CLUSTERS AND/OR A PLURALITY OF CLUSTER REPRESENTATIVES

- 908 — DETERMINING, BY THE SYSTEM, A PROBABILITY THAT ONE OR MORE CLUSTER REPRESENTATIVES FROM THE PLURALITY OF CLUSTER REPRESENTATIVES ARE EFFECTS OF ANOTHER CLUSTER REPRESENTATIVE FROM THE PLURALITY OF CLUSTER REPRESENTATIVES

- 910 — GENERATING, BY THE SYSTEM, AN ACTION MODEL BASED ON THE DOMAIN MODEL, WHEREIN THE ACTION MODEL CAN COMPRISE A SEQUENCE OF ACTIONS FOR ACCOMPLISHING THE GOAL

- 912 — DETERMINING, BY THE SYSTEM, A QUALITY OF THE ACTION MODEL

US 10,699,200 B2

AUTONOMOUS LEARNING OF ACTIONABLE MODELS FROM UNSTRUCTURED DATA

BACKGROUND

The subject disclosure relates to generating a domain model and/or an action model, and more specifically, to autonomously generating a domain model and/or an action model from online data.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that facilitate generating a domain model and/or an action model based on online data are described.

According to an embodiment, a computer-implemented method is provided. The computer-implemented method can comprise extracting, by a system operatively coupled to a processor, a plurality of actions from a non-numerical language. The plurality of actions can achieve a goal. The computer-implemented method can further comprise generating, by the system, a domain model based on the plurality of actions. The computer-implemented method can also comprise generating, by the system, an action model based on the domain model. The action model can comprise an action transition for accomplishing the goal.

According to another embodiment, a system is provided. The system can comprise a memory that stores computer executable components. The system can also comprise a processor, operably coupled to the memory, and that executes the computer executable components stored in the memory. The computer executable components can comprise an extraction component that extracts a plurality of actions from unstructured data presented in a non-numerical language. The plurality of actions can achieve a goal. The computer executable components can also comprise a trace component that generates a domain model based on the plurality of actions. Further, the computer executable components can comprise a probability component that generates an action model based on the domain model. The action model can comprise a sequence of actions for accomplishing the goal.

According to another embodiment, a computer program product is provided. The computer program product can comprise a computer readable storage medium having program instructions embodied therewith. The program instructions can be executable by a processing component to cause the processing component to extract a plurality of actions from unstructured data presented in a non-numerical language. The plurality of actions can achieve a goal. The program instructions can further cause the processing component to generate a domain model based on the plurality of actions. Also, the program instructions can cause the processing component to generate an action model based on the domain model. The action model can comprise a sequence of actions for accomplishing the goal.

BRIEF DESCRIPTION OF THE DRAWINGS

FIG. 5 illustrates another chart of an example, non-limiting dataset regarding the quality of an action model in accordance with one or more embodiments described herein.

FIG. 7 illustrates a diagram of an example, non-limiting dataset describing action paths regarding an action model in accordance with one or more embodiments described herein.

FIG. 8 illustrates a flow diagram of an example, non-limiting method that facilitates autonomously generating a domain model and/or an action model based on unstructured data in accordance with one or more embodiments described herein.

FIG. 9 illustrates another flow diagram of an example, non-limiting method that facilitates autonomously generating a domain model and/or an action model based on unstructured data in accordance with one or more embodiments described herein.

DETAILED DESCRIPTION

Figure 1:
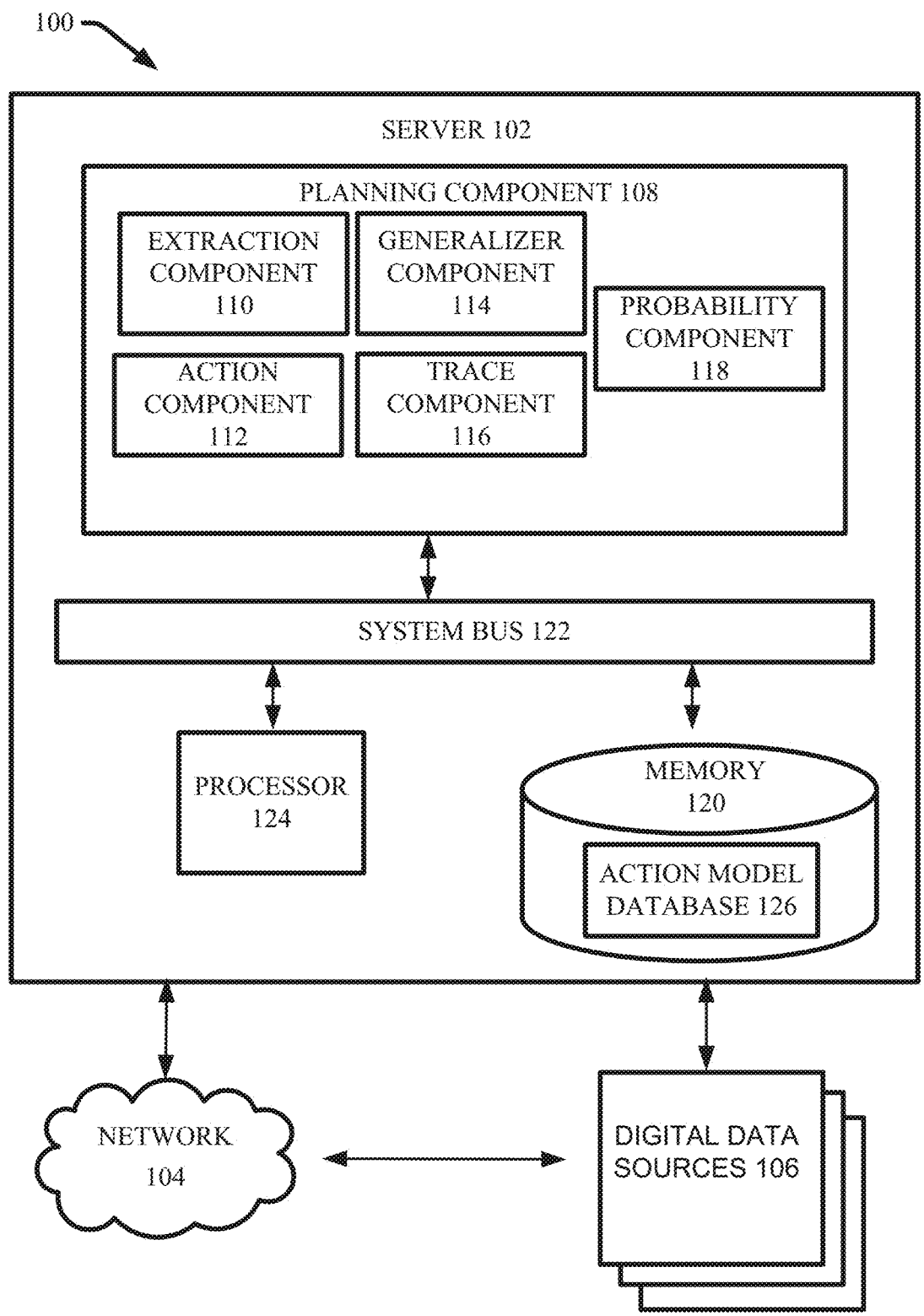
FIG. 1 illustrate a block diagram of an example, non-limiting system that facilitates autonomously generating a domain model and/or an action model based on unstructured data in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As social media and internet communities continue to grow, a wealth of user-generated data is accumulating on the Internet, and there is a growing interest in exploiting this data to provide data-based decision making using artificial intelligence (AI) planning systems. For example, there is increasing interest in support for complex scenarios that require planning and/or sequential decision making.

An AI planning system can include a set of predicates (e.g., a set of fluents or facts), an initial state, a set of action operators (e.g., an action model that can include action names, action pre-conditions, action effects, and/or delete effects), and a goal condition. A combination of the predicates, the initial state, and the set of action operators can be referred to as a domain model. An action model can include an action sequence based on the domain model that if executed from the initial state, the resulting state achieves and/or contains the goal condition. Further, each action in the sequence of actions can have an associated cost, and a cost of the action model can be calculated by summing the cost of each action.

Applications that can utilize AI planning systems include, but are not limited to: diagnostic problem solving (e.g., trying to realize a fault or error), plan recognition (e.g., trying to infer the goals and/or plans of an agent), and/or explanation generation (e.g., trying to explain observations). However, conventional AI planning systems face several challenges and limitations. For example, it is not often the case that the data to be analyzed by the AI planning system is expressed in a structured form or in a planning domain definition language (PDDL). Thus, an expert in the data's domain is required to translate the data into PDDL (e.g., using tools such as, but not limited to: O-PLAN™, SIPE™, and/or GIPO™). Also, possible executions of the plans (e.g., plan tracers) that can be used to learn the data is often not available. Thus, AI planning systems have been limited to situation in which the full PDDL specification of the data description is given and/or the set of plan tracers is available.

Various embodiments of the present invention are directed to computer processing systems, computer-implemented methods, apparatuses and/or computer program products that can autonomously (e.g., with direct human guidance) establish AI domain models and/or action models from unstructured data to provide complex decision making plans to achieve a goal. Example goals can include, but are not limited to: quitting smoking, building conditioning to run a five kilometer distance, improving health, losing weight, planning a special even (e.g., a wedding), and passing a test. Numerous groups (e.g., self-help groups) exist on the Internet that share information regarding the accomplishment of a goal, such as but not limited to: quitting smoking, losing weight, and/or world traveling. For instance, a given goal can be to quit smoking, and social media outlets can provide a plethora of user-generated data regarding user experiences, knowledge, and/or theories describing how to do so. In one or more embodiments described herein, user-generated data (e.g., text posts and/or commentary) can be analyzed to establish an action model, and a plan can be generated that can increase a likelihood of achieving a goal.

In order to facilitate generating decision-making plans based on unstructured data, one or more embodiments described herein can include analyzing data extracted from a domain in a global corpus (e.g., the Internet), establishing a sequence of actions, and generating one or more action models. In one or more embodiments, the data can include user commentary generated by one or more entities on one or more social media outlets on the Internet. The commentary can include one or more actions performed by one or more social media users which facilitates achievement of a goal. For example, the one or more actions can include a dietary schedule performed by one or more users to facilitate weight loss.

The computer processing systems, computer-implemented methods, apparatus and/or computer program products employ hardware and/or software to solve problems that are highly technical in nature (e.g., related to autonomous extraction of actions from unstructured data in a global corpus to develop a complex planning and/or sequential decision making solution), that are not abstract and cannot be performed as a set of mental acts by a human. For example, a human, or even a multitude of humans, cannot effectively manually analyze the insurmountable amount of unstructured data shared via the Internet to extract actions that a decision-making model can be based upon. Further, no human can stay current with the vast amount of new unstructured data added each minute, hour, and/or day via the Internet.

FIG. 1. Illustrates a block diagram of an example, non-limiting system 100 that facilitates generating an action model based on unstructured data retrieved from a global corpus. Aspects of systems (e.g., system 100 and the like), apparatuses or processes explained in this disclosure can constitute one or more machine-executable components embodied within one or more machines, e.g., embodied in one or more computer readable mediums (or media) associated with one or more machines. Such components, when executed by the one or more machines, e.g., computers, computing devices, virtual machines, etc. can cause the machines to perform the operations described.

As shown in FIG. 1, the system 100 can include a server 102, one or more networks 104, and one or more digital data sources 106. The server 102 can include planning component 108, which can include extraction component 110, action component 112, generalizer component 114, trace component 116, and probability component 118. The server 102 can also include or otherwise be associated with at least one memory 120. The server 102 can further include a system bus 122 that can couple the various components including, but not limited to, the planning component 108 and associated components, memory 120 and/or processor 124. While a server 102 is shown in FIG. 1, in other embodiments, any number of different types of devices can be associated with or include the components shown in FIG. 1 as part of the planning component 108. All such embodiments are envisaged.

The planning component 108 can facilitate generating an action model based on unstructured data and a plan based on the action model, wherein the plan can facilitate an increase likelihood of accomplishing a goal. The term "unstructured data" can refer to digital data presented in unrestricted natural language and meant for human consumption. Unstructured data can include, but is not limited to: social media posts and/or commentary, and associated metadata, made by one or more users (e.g., posts made to the FACEBOOK®, TWITTER®, and/or INSTAGRAM® websites and/or mobile applications), social news posts and/or commentary, and associated metadata, (e.g., posts made to the REDDIT® website and/or mobile application), and/or posts and/or commentary, and associated metadata, on one or more websites which foster discussion (e.g., YOUTUBE® and/or Internet forums). The unstructured data can be generated by one or more entities (e.g., social media users) and can include information contributed to a global corpus (e.g., the Internet and/or a website) in a non-numerical language (e.g., a spoken language) intended for human consumption.

The extraction component 110 can extract unstructured data, which is relevant to one or more goals, from the one or more digital data sources 106. The digital source 106 can include one or more websites and/or mobile applications where users can submit unstructured data in various forms (e.g., Internet uniform resource locators (URLs) and/or text posts). Also, along with sharing content of the digital data source 106, visitors of the digital data source 106 can comment and vote on unstructured data to establish popularity of rank of the unstructured data in regards to a given topic. Content entries on the digital data source 106 can be designed in a tree format where each branch represents a sub-community. Further, the sub-communities can be categorized to one or more domains, and the domains can regard a variety of topics and/or goals with a variety of specificity. In an embodiment, the extraction component 110 can simultaneously extract unstructured data from a plurality of domains, each relating to the same goal or different goals, of digital data source 106. In another embodiment, the extraction component 110 can simultaneously extract unstructured data from a plurality of digital data sources 106, each relating to the same goal or different goals.

In various embodiments, the extraction component 110 can extract unstructured data from one or more digital data sources 106. The one or more digital data sources 106 can include unstructured data that is accessible to the server 102 either directly or via one or more networks 104 (e.g., an intranet, the Internet, and/or a combination thereof). For example, the one or more digital data sources 106 can include a computer-readable storage device (e.g., a primary storage device, a secondary storage device, a tertiary storage device or an off-line storage device) that can store user-generated data. In another example, the one or more digital data sources 106 can include a community host that includes a website and/or application that facilitates sharing of user-generated data via a network (e.g., the Internet). In some implementations, the extraction component 110 can extract unstructured data that is uploaded to the server 102 by a client device. For example, the website can include a user-generated data source that can access a quantity of shared user-generated data that is uploaded to the website by users of the website. The website can further share this user-generated data to client devices of respective users of the website via the one or more networks 106.

In one or more embodiments, the extraction component 110 can browse the digital data sources 110 for new user-generated data. For example, the extraction component 110 can crawl various websites, applications, and network accessible storage devices for user-generated data that relates to a subject goal and can be utilized to develop an action model. In various embodiments, the extraction component 110 can be or include hardware (e.g., a central processing unit (CPU), a transceiver, a decoder), software (e.g., a set of threads, a set of processes, software in execution) or a combination of hardware and software that facilitates extracting user-generated data from one or more digital data sources 106.

The one or more servers 102, including planning component 108, and the one or more digital data sources 106 can be connected either directly or via one or more networks 104. Such networks 104 can include wired and wireless networks, including, but not limited to, a cellular network, a wide area network (WAN) (e.g., the Internet) or a local area network (LAN). For example, the server 102 can communicate with one or more digital data sources 106 (and vice versa) using virtually any desired wired or wireless technology, including, for example, cellular, WAN, wireless fidelity (Wi-Fi), Wi-Max, WLAN, and etc. Further, although in the embodiment shown the planning component 108 is provided on a server device 102, it should be appreciated that the architecture of system 100 is not so limited. For example, the planning component 108 or one or more components of planning component 108 can be located at another device, such as another server device, a client device, etc.

The extraction component 110 can utilize a web crawler (e.g., the Python Reddit API Wrapper (PRAW)) to browse one or more digital data sources 106 for unstructured data that is relevant to a subject goal. The extraction component 110 can browse the digital data sources 106 using a variety of techniques depending on the architecture of the subject digital data source 106, such as searching for domains within the digital data source 106 which are relevant to the subject goal and filtering the unstructured data in any identified domains. The extraction component 110 can search the unstructured data for one or more landmarks that can indicate that the unstructured data relates to the goal (e.g., "tobacco" can be a landmark that indicates that the subject unstructured data relates to the goal of quitting smoking). The extraction component 110 can filter unstructured data from a domain tagged "stop smoking" when the subject goal is to quit smoking. For example, if the goal is to quit smoking, the extraction component 110 can browse a domain tagged "stop smoking" and filter out unstructured data relating to a quitting smoker, such as the social media user's posts and any time stamps associated with the posts. Provided below is running example of unstructured data (e.g., a social media post) that can be extracted by the extraction component 110 to describe various embodiments of the present invention "I spent few weeks drinking and partying. In a similar situation in the past, I take a cigarette and used to smoke pretty much non-stop. But this season I was confronted by the triggers. Smoking in restaurants, communal areas. Many times I thought I can get a cigarette now. But those thoughts are always chased by reason and the power of conviction I have to quit smoking."

Once the extraction component 110 identifies and extracts unstructured data relating to the subject goal, the action component 112 can determine one or more actions, and their potential parameters, described in the unstructured data. The action component 112 can extract fragments of the unstructured data to constitute action names and/or action parameters for generating an action model. For example, the action component 112 can utilize a tagger (e.g., Stanford part of speech tagger) to extract verbs and nouns of one or more sentences in the extracted unstructured data. Each extracted verb can be a candidate for an action name. The order of sentences in the unstructured data can be indicative of the order of the extracted actions. Extracted unstructured data can have one or more sentences, and each sentence can have one or more verbs. For example, in the plan trace (i.e. the sequence of actions) one or more action names extracted from a first sentence of the unstructured data can be positioned before one or more action names extracted from a second sentence of the unstructured data.

Additionally, each extracted noun can be a candidate action parameter. Further, the action component 112 can attach an action parameter to an action name based at least on co-occurrence of the action parameter with a given action name in the unstructured data. For example, if there is an action name in the unstructured data that occurs in multiple plan traces and co-occurs with multiple action parameters, the action parameter with the largest co-occurrence frequency with the action name can be chosen by the action component 112 to be the action parameter associated with the action name in an action model. Also, the action component 112 can associate an action parameter with one or more action names. For example, in regards to the running example provided above, action name_action parameter associations that can be extracted by the action component 112 can include, but are not limited to: spent_smoke, drink_beer, party_hard, take_day, smoke_day, thought_smoke, chase_life, and/or quit_smoke.

The generalizer component 114 can refine a set of action names extracted by the action component 112 in order to remove redundancies. For example, the generalizer component 114 can apply a hierarchical clustering approach by utilizing a Leacock Chodorow similarity metric (Sim) to measure a distance between any two given action names ($W_i$ and $W_j$). The Leacock Chodorow similarity can be computed, for example, by Equation 1 shown below; wherein $Dist(cn_i, cn_j)$ is the shortest distance between concepts $cn_i$ and $cn_j$ and D is the maximum depth of a taxonomy.

$$Sim(W_i, W_j) = Max[\log 2D - \log Dist(cn_i, cn_j)] \quad (1)$$

Concept can refer to the general topic of a collection. For example, in the sentence "Mary's intelligence impressed her teacher," intelligence can be the concept. Also, the generalizer component 114 can access a wordnet database to measure distance between different concepts and/or action names. Further, an agglomerative approach can be utilized to group semantically similar action names into a cluster. Since the unstructured data can be in the form of a spoken language (e.g., English, Spanish, German, French, Portuguese, Russian, etc.), as opposed to a numerical language, the generalizer component 114 can decide how to compute a distance between any two given clusters. Types of linage metrics that the generalizer component 114 can use to measure the distance metric include, but are not limited to: single linkage metrics, complete linkage metrics, and/or average linkage metrics. For example, the generalizer component 114 can utilize complete linkage metric, and the agglomerative clustering algorithm can terminate in response to a closeness metric being greater than the complete linkage metric at any given time. The generalizer component 114 can group semantically similar action names, and associated action parameters, into a same cluster in response to termination of the agglomerative clustering algorithm.

Once the action names are clustered, the generalizer component 114 can determine one or more action names that represent a given cluster, known as a cluster representative. The generalizer component 114 can determine the cluster representative using one or more word embedding techniques such as, but not limited to: term frequency-inverse document frequency (TFIDF) techniques, TFIDF based cosine techniques, word to vector techniques, and/or word to vector based cosine techniques. For example, the generalizer component 114 can utilize TFIDF techniques to choose an action name with the highest TFIDF value to be the cluster representative. The generalizer component 114 can utilize Equations 2-4, shown below, to facilitate computing TFIDF values.

$$tf(t, d) = \frac{f_{t,d}}{\max f_{t',d} : t' \in d} \quad (2)$$

$$idf(t, D) = \log \frac{N}{|d \in D : t \in d|} \quad (3)$$

$$tfidf(t, d, D) = tf(t, d) * idf(t, D) \quad (4)$$

The variable t can represent the term and can be a subject action name; variable f can represent a frequency (e.g., frequency of the term (tf)); variable i can represent an inverse (e.g., inverse document frequency (idf)); variable d can be total unstructured data of one user contributing to the global corpus browsed by the extraction component 110; variable N is the total number of unique users that contribute to the extracted unstructured data; and variable D can be the total unstructured data extracted by the extraction component 110. Thus, the generalizer component 114 can generate one or more clusters and designate one or more action names as the cluster representative. Also, the generalizer component 114 can map extracted action names to the cluster representative of their respective cluster. For example, in regards to the running example provided above, action names mapped to cluster representatives by the generalizer component 114 can include, but is not limited to: "spent" mapped to "spend", "drink" mapped to "party", and/or "take" mapped to "taken."

The trace component 116 can turn initial plan fragments into plan traces. Initial plan fragments can include the action names (i.e. initial action names) and associated action parameters (i.e. initial action parameters) determined by the action component 112 prior to the clustering performed by the generalizer component 114. The trace component 116 can replace an initial action name and/or associate initial action parameter with the cluster representative for the subject initial action name's respective cluster and an action parameter associated with the cluster representative. Further, the trace component 116 can replace two or more sequential initial action names of the same cluster with the cluster representative of the subject cluster. For example, if an initial plan fragment includes the action name (a) sequence: $[a_1, a_2, a_2, a_4, a_5]$ (wherein each sub-numeral (e.g., 1, 2, 4, and 5) can denote a respective cluster (e.g., cluster 1, cluster 2, cluster 4, and cluster 5)), the trace component 116 can replace the initial plan fragment with the cluster representative (c) sequence: $[c_1, c_2, c_4, c_5]$ to form a plan trace. One or more of the plan traces generated by the trace component 116 can comprise a domain model for the subject goal.

The probability component 118 can extract action preconditions and action affects for each action name included in a plan trace. Due to at least co-occurrence in the plan traces, action names can be inter-related with other action names with a probability ($p_{i,j}$) describing a chance of a cluster representative $c_j$ following another cluster representative $c_i$. For example, the probability component 118 can consider a constraint metric (e.g., a sequence probability threshold) to decide whether a co-occurring relationship can be considered in formation of an action model.

The probability ($p_{i,j}$) can be computed through data-driven techniques. For example, $c_1$ and $c_2$ can be two actions where $c_1$ is an effect of $c_2$. In which case, unless $c_2$ is executed, $c_1$ cannot be executed. The probability component 118 can utilize Equation 5, presented below, wherein $c_1$ can be a post-condition of $c_2$ if $p(c_1 | c_2)$ is greater than a probability metric, and $c_2$ can be a pre-condition of $c_1$. The ∩ in Equation 5 can represent an ordered conjunction that considers the sequentially of $c_1$ and $c_2$.

$$p(c_1 | c_2) = p(c\text{?}1\text{?} \cap c\text{?}2\text{?}) \text{?} p(c\text{?} p(c_1 | c_2) = \frac{p(c_1 \cap c_2)}{p(c_2)} \quad (5)$$

Figure 2:
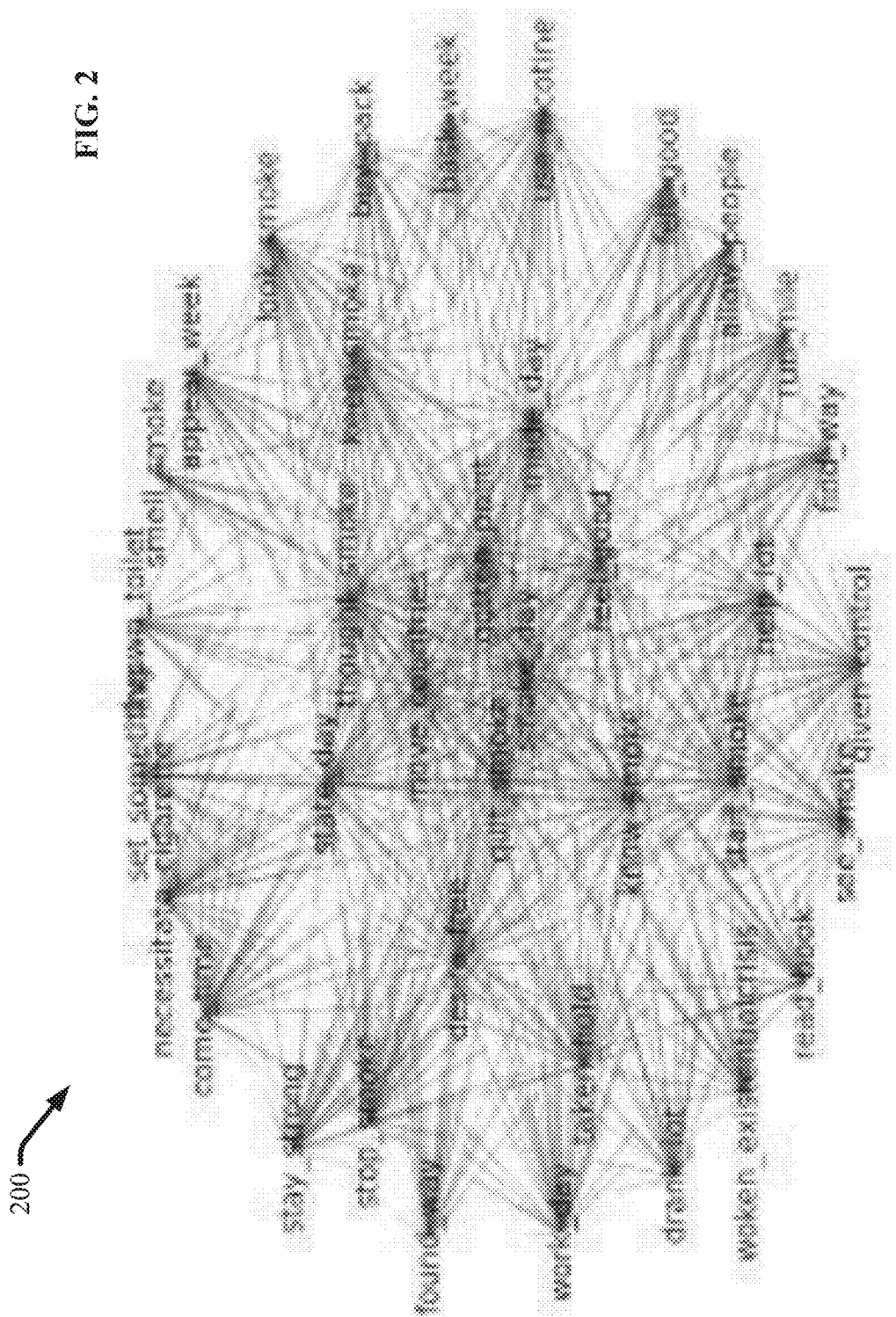
FIG. 2 illustrates a diagram of an example, non-limiting action precedence graph in accordance with one or more embodiments described herein.

In various embodiments, the probability component 118 can determine probabilities that establish a relationship between different action names in a set of plan traces. Also, the probability component 118 can generate an action model represented as a precedence graph that illustrates actions (e.g., cluster representatives) and the transitions between different actions that are associated with weights. For example, a precedence graph can illustrate the plan traces (e.g., sequence of actions) determined by the trace component 116 along with the associate probabilities determined by the probability component 118. FIG. 2 illustrates an example, non-limiting, action precedence graph 200 that can be generated by the probability component 118 regarding the running example "Quit Smoking" domain. Repetitive description of like elements employed in other embodiments described herein is omitted for sake of brevity. Referring again to FIG. 1, one or more action models generated by the probability component 118 can be kept in the memory 120 via an action model database 126.

Figure 3:
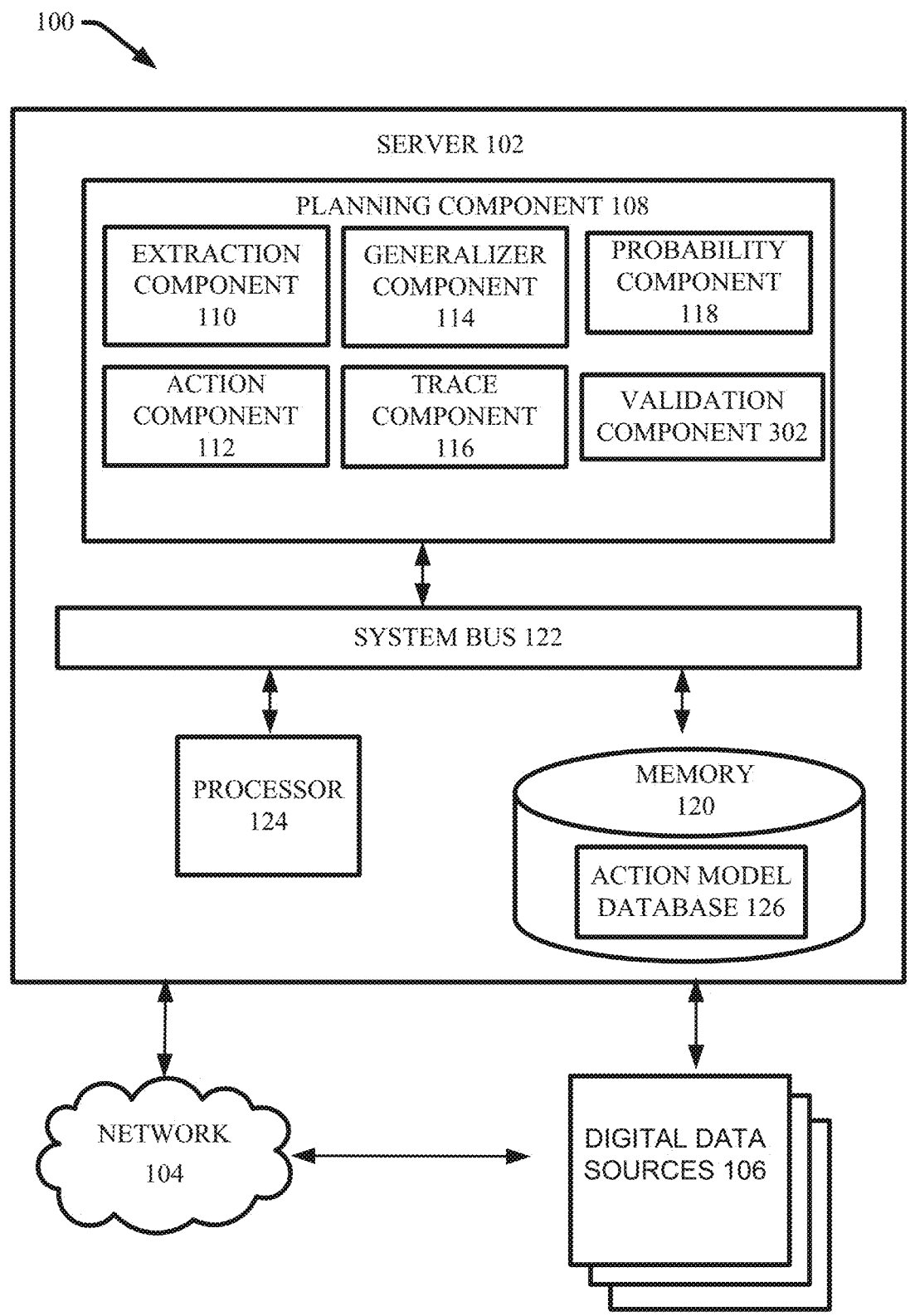
FIG. 3 illustrate another block diagram of an example, non-limiting system that facilitates autonomously generating a domain model and/or an action model based on unstructured data in accordance with one or more embodiments described herein.

Referring to FIG. 3, the system 100 can also include validation component 302 to measure a quality of the action model generated by the probability component 118. One or more nodes of the action precedence graph (e.g., the action model) can represent an action name (e.g., a cluster representative) and one or more edges can be an action transition between two or more action names. Also, the support-based probability ($p_{i,j}$) can be an edge weight between two or more nodes. An action transition with the highest edge weight can be the primary path of the action model. The validation component 302 can determine a metric, hereinafter referred to as "explainability," that indicative of the quality of the action model. The validation component 302 can divide the extracted unstructured data into one or more training datasets and one or more testing datasets. One or more training datasets can be utilized to build the action model, whereas one or more testing datasets can be utilized to validate the action model. For example, the validation component 302 can utilize Equations 6 and 7, shown below, where T can be a set of transitions between actions present in the action model and T' can be a set of transitions between actions present in a test dataset. The explainability value can be expressed as a percentage and represent the number of action and/or action sequences that can be explained (e.g. correlated) by the subject action model.

$$T'' = T \cap T' \quad (6)$$

$$\text{Explainability} = \frac{|T''|}{|T'|} \quad (7)$$

Figure 4:
FIG. 4 illustrates a chart of an example, non-limiting dataset regarding the quality of an action model in accordance with one or more embodiments described herein.

FIG. 4 illustrates an example, non-limiting chart 400 that shows the effect that a cluster threshold 402 can have on the explainability of an action model. Repetitive description of like elements employed in other embodiments described herein is omitted for sake of brevity. The cluster threshold 402 can be the closeness metric considered by the generalizer component 114. The validation component 302 can consider how variance in the cluster threshold 402 can effect explainability. The validation component 302 can analyze the cluster threshold 402 of a subject action model to verify the explainability of the action model (e.g., verify that the quality of the action model is satisfactory). For example, the validation component 302 can alter the cluster threshold 402 value (e.g., increasing or decreasing the cluster threshold value 402) one or more times to compute a desirable explainability value. In one embodiment, the validation component 302 can alter the cluster threshold 402 value once. In another embodiment, the validation component 302 can alter the cluster threshold 402 two or more times.

The chart 400 shows the effect of the cluster threshold 402 of the explainability of three example action models: a first action model 404 (e.g., an action model based on a quit smoking domain model), a second action model 406 (e.g. an action model based on a learning to run domain model), and a third action model 408 (e.g. an action model based on a wedding planning domain model). The cluster threshold 402 can affect the tightness of the clustering executed by the generalizer component 114. The larger the cluster threshold 402 value, the larger the number of clusters that can be generated by the generalizer component 114 and vice versa. The cluster threshold 402 value can vary between, for example, 1 to 2.5. For example, the cluster threshold 402 value can be 1.75. As the cluster threshold 402 value decreases, the explainability value of the action model increases (e.g., indicating good quality) at least because the execution of agglomerative clustering, performed by the generalizer component 114, terminates sooner. Action models with a large number of clusters can also have a large number of actions (e.g., cluster representatives); and as the amount of linguistic redundancy in the training dataset increases the validity component 302 can have difficulty explaining the action sequences of the test dataset (e.g., determine a low explainability value).

For example, there can be two action names ($a_1$ and $a_2$) which are synonyms of each other and two action transitions (e.g., action sequences): (1) $t_1$: $a_1$ to $a_k$; and (2) $t_2$: $a_2$ to $a_k$. As the cluster threshold 402 value increases, the possibility that the two action names ($a_1$ and $a_2$) are in different clusters also increases. If the generalizer component 114 groups the two action names ($a_1$ and $a_2$) into two separate clusters, then the two action transitions ($t_1$ and $t_2$) can be considered two distinct transitions by the validation component 302. If one of the two action transitions ($t_1$ and $t_2$) is included in the action model while the other action transition is based on the testing dataset, then the validation component 302 can compute a low explainability value thereby indicating a poor quality result for the action model. A poor quality result can be computed if the validation component 302 determines that the action model fails to consider one or more action names and/or action transitions derived from the testing dataset.

In another example, as the cluster threshold 402 value decreases, the possibility that the two action names ($a_1$ and $a_2$) are in different clusters also decreases. If the generalizer component 114 groups the two action names ($a_1$ and $a_2$) into the same cluster, then the two action transitions ($t_1$ and $t_2$) can be considered the same transition by the validation component 302. If one of the two action transitions ($t_1$ and $t_2$) is included in the action model while the other action transition is based on the testing dataset, then the validation component 302 can compute a high explainability value thereby indicating a good quality result for the action model. A good quality result can be computed if the validation component 302 determines that the action model is successful in considering one or more action names and/or action transitions derived from the testing dataset.

FIG. 5 illustrates an example, non-limiting chart 500 that shows the effect that a sequence probability threshold 502 can have on the explainability of an action model. Repetitive description of like elements employed in other embodiments described herein is omitted for sake of brevity. The sequence probability threshold 502 can be the probability metric considered by the probability component 118. The validation component 302 can also analyze the sequence probability threshold 502 of a subject action model, separately or in conjunction with the cluster threshold 402, to verify the explainability of an action model (e.g., verify that the quality of the action model is satisfactory). For example, the validation component 302 can alter the sequence probability threshold 502 value (e.g., increasing or decreasing the sequence probability threshold 502 value) one or more times to compute a desirable explainability value. A negative correlation can exist between the sequence probability threshold 502 value of an action model and the explainability value the subject action model (e.g., as the sequence probability 502 threshold value increases, a chance for action names to be included in a subject action model decreases). The sequence probability threshold 502 can be, for example, a value less than or equal to 0.015.

Additionally, the validation component 302 can analyze the size of one or more training datasets regarding a subject action model, separately or in conjunction with the cluster threshold 402 and/or the sequence probability threshold 502, to verify the explainability of the action model. The validation component 302 can vary the division of the extracted unstructured data between the training dataset and the test dataset. For example, the validation component 302 can divide 80 percent of the extracted unstructured data into a training dataset for construction of the action model and the remaining 20 percent of the extracted unstructured data into a testing dataset for checking the quality of the action model. In various embodiments, the validation component 302 can divide the extracted unstructured data into any combination of training data and test data that sums to 100 percent. For example, 50 percent of the unstructured data can be divided into the training dataset, while the remaining 50 percent is divided into the test dataset. Additionally, any division between the training dataset and the test dataset which accumulates to 100 percent of the extracted unstructured data is also envisaged (e.g., 40 percent of the extract unstructured data allocated to the training dataset and 60 percent of the extracted unstructured data allocated to the test dataset).

Chart 500 shows example explainability data determined by the validation component 302 in regards to three example action models (e.g., the first action model 404, the second action model 406, and the third action model 408) generated by system 100. The explainability values presented within parenthesis regard a 50 percent division of a training dataset and a test dataset. The explainability values outside the parenthesis regard a division in which 80 percent of the unstructured data is allocated as training data and 20 percent of the unstructured data is allocated as testing data.

The results of chart 500 show that system 100 can generate good quality action models that can explain new action sequences with minimal information loss (e.g., information loss equal to or less than 6 percent). Chart 500 further illustrates the system 100's unprecedented ability to leverage unstructured data to automatically build action models to perform sequential decision making.

The validation component 302 can also evaluate the action model using one or more planners such as, but not limited to, Fast Downward Planner. By utilizing a planner the validation component 302 can identify, for a given set of goals, the number of goals that the subject action model can achieve. Also, by utilizing a planner the validation component 302 can determine how many plan traces the action model can explain (e.g., how many plan traces the action model can correlate).

Figure 6:
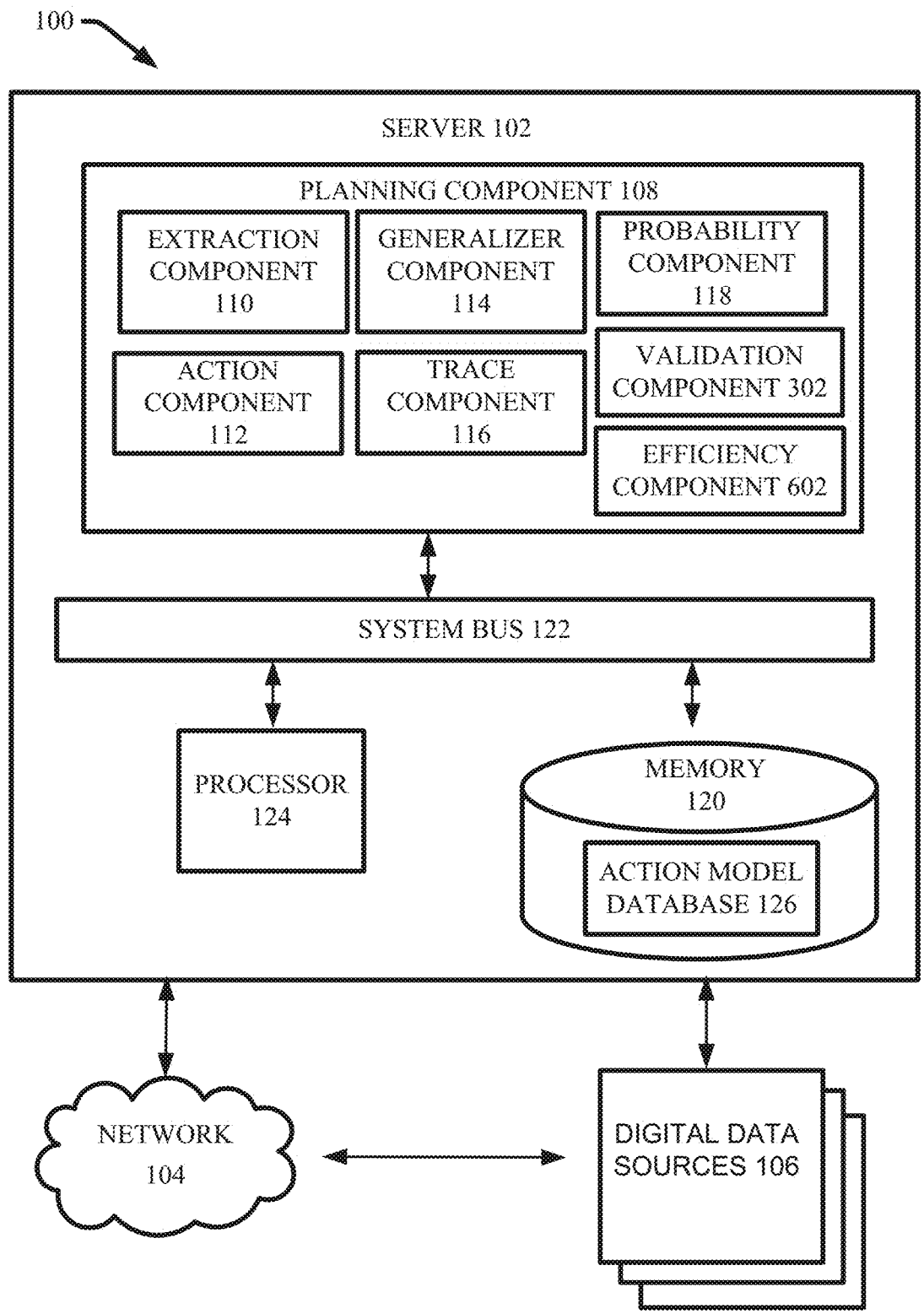
FIG. 6 illustrate another block diagram of an example, non-limiting system that facilitates autonomously generating a domain model and/or an action model based on unstructured data in accordance with one or more embodiments described herein.

FIG. 6 illustrates a block diagram of the example, non-limiting, system 100 that can further comprise efficiency component 602 that can measure the efficiency of an action model. Repetitive description of like elements employed in other embodiments described herein is omitted for sake of brevity. The efficiency component 602 can determine one or more of the shortest paths from a given source node in the action model to a goal node. For example, in the running example Quit Smoking domain, the source node can be start_smoke and the goal node can be quit_smoke. The efficiency component 602 can utilize one or more algorithms, such as Djikstra's shortest path algorithm, to determine a shortest route by satisfying one or more given constraints. Also, the efficiency component 602 can employ the NetworkX Python library.

FIG. 7 illustrates a diagram 700 showing example action paths ($P_1$, $P_2$, $P_3$, $P_4$, $P_5$, $P_6$, $P_7$, $P_8$, and $P_9$) that can be identified by the efficiency component 602 in regards to the first action model 404, the second action model 406, and the third action model 408. Repetitive description of like elements employed in other embodiments described herein is omitted for sake of brevity. For example, plan $P_1$ can describe that first accepting the cold turkey approach and then following it every day to eventually quit smoking. In another example, plan $P_4$ can describe that being recommended to use the subreddit "c25K" can help a user sign up for a contest and then compete in the contest. By identifying action paths from the action model, the efficiency component 602 can also identify paths that are not actionable. For example, while action path $P_5$ can describe a shortest route from the initial state to the goal, the action sequence is illogical and therefore not actionable.

FIG. 8 illustrates an example, non-limiting method 800 that facilitates automatically generating an action model based on unstructured data. Repetitive description of like elements employed in other embodiments described herein is omitted for sake of brevity. At 802, the method 800 can comprise extracting, by a system 100 operatively coupled to a processor 124, a plurality of actions from a non-numerical language (e.g., via extraction component 110 and/or action component 112). The plurality of actions can regard a goal. At 804, the method 800 can further comprise generating, by the system 100, a domain model based on the plurality of actions (e.g., via generalizer component 114 and/or trace component 116). Also, at 806 the method 800 can comprise generating, by the system 100, an action model based on the domain model (e.g., via probability component 118). The action model can comprise an action transition for accomplishing the goal.

FIG. 9 illustrates another example, non-limiting method 900 that facilitates automatically generating an action model based on unstructured data. Repetitive description of like elements employed in other embodiments described herein is omitted for sake of brevity. At 902, the method 900 can comprise extracting, by a system 100 operatively coupled to a processor 124, a plurality of actions from unstructured data presented in a non-numerical language (e.g., via extraction component 110 and/or action component 112). The plurality of actions can achieve a goal. The non-numerical language can be a text (e.g., presented in English) shared over a global corpus (e.g., the Internet) that can be generated by a plurality of entities (e.g., social media users). At 904, the method 900 can further comprise generating, by the system 100, a domain model based on the plurality of actions (e.g., via generalizer component 114 and/or trace component 116). One or more actions from the plurality of actions can be grouped into a cluster based on similarity of the actions. At 906 the method 900 can also comprise generating, by the system 100, identifying, by the system 100, an action within the cluster as a representative. The domain model can comprise a plurality of clusters and/or a plurality of cluster representatives. At 908, the method 900 can comprise determining, by the system 100, a probability that one or more cluster representatives from the plurality of cluster representatives are effects of another cluster representative from the plurality of cluster representatives. At 910, the method 900 can comprise generating, by the system 100, an action model based on the domain model (e.g., via probability component 118). The action model can comprise a sequence of actions for accomplishing the goal. At 912, the method 900 can comprise determining, by the system 100, a quality of the action model.

Figure 10:
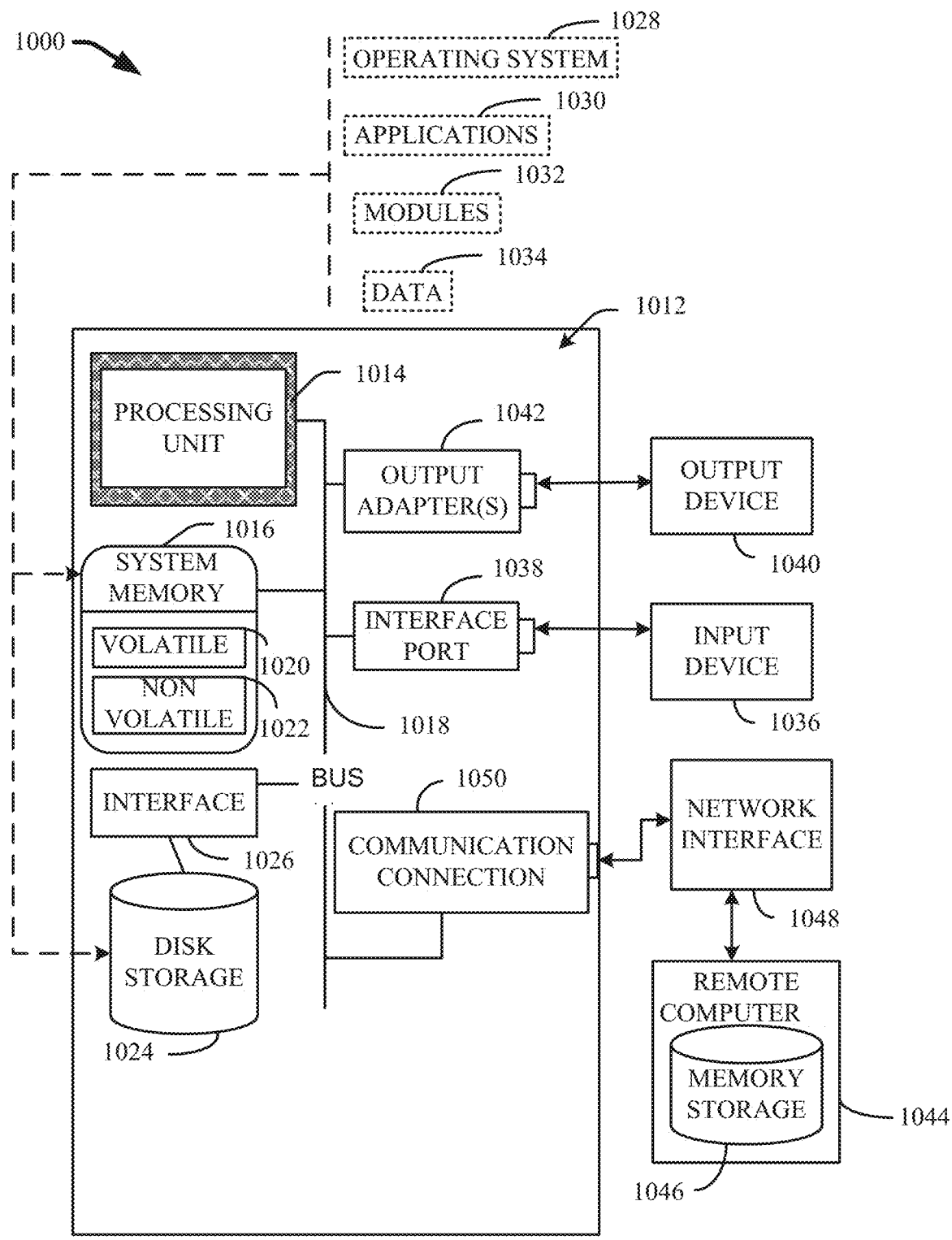
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can include a computer 1012. The computer 1012 can also include a processing unit 1014, a system memory 1016, and a system bus 1018. The system bus 1018 can operably couple system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, can be stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface can be used, such as interface 1026. FIG. 10 also depicts software that can act as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 can take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through one or more input devices 1036. Input devices 1036 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 1014 through the system bus 1018 via one or more interface ports 1038. The one or more Interface ports 1038 can include, for example, a serial port, a parallel port, a game port, and a universal serial bus (USB). One or more output devices 1040 can use some of the same type of ports as input device 1036. Thus, for example, a USB port can be used to provide input to computer 1012, and to output information from computer 1012 to an output device 1040. Output adapter 1042 can be provided to illustrate that there are some output devices 1040 like monitors, speakers, and printers, among other output devices 1040, which require special adapters. The output adapters 1042 can include, by way of illustration and not limitation, video and sound cards that provide a means of connection between the output device 1040 and the system bus 1018. It should be noted that other devices and/or systems of devices provide both input and output capabilities such as one or more remote computers 1044.

Computer 1012 can operate in a networked environment using logical connections to one or more remote computers, such as remote computer 1044. The remote computer 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer 1044. Remote computer 1044 can be logically connected to computer 1012 through a network interface 1048 and then physically connected via communication connection 1050. Further, operation can be distributed across multiple (local and remote) systems. Network interface 1048 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    extracting, by a system operatively coupled to a processor, a plurality of actions from a non-numerical language, wherein the plurality of actions achieve a goal defined by a user;
    generating, by the system, a domain model based on the plurality of actions, wherein the domain model comprises a plurality of cluster representatives;
    generating, by the system, an action model based on the domain model, wherein the action model comprises an action transition between at least two actions of the plurality of actions for accomplishing the goal, and wherein the generating the action model comprises:
        grouping one or more actions from the plurality of actions into a plurality of clusters based on similarity of the one or more actions;
        identifying respective actions within clusters of the plurality of clusters as cluster representatives, and
        determining a probability that one or more cluster representatives from the cluster representatives are effects of another cluster representative from the cluster representatives; and
    presenting the action model to the user.

2. The computer-implemented method of claim 1, wherein the non-numerical language is a text shared over a global corpus.

3. The computer-implemented method of claim 2, wherein the text is in English language and the global corpus is the Internet.

4. The computer-implemented method of claim 2, wherein the text is generated by a plurality of entities.

5. The computer-implemented method of claim 1, further comprising determining a quality of the action model.

6. The computer-implemented method of claim 1, further comprising determining an efficiency of the action model.

7. The computer-implemented method of claim 1, wherein the action model is probabilistic.

8. The computer-implemented method of claim 1, wherein the action transition is a sequence of actions from the plurality of actions.

9. The computer-implemented method of claim 1, wherein the presenting the action model to the user comprising presenting a graph of the action model.

10. The computer-implemented method of claim 9, wherein the graph depicts a path through the graph representing the action transition.

11. The computer-implemented method of claim 10, wherein nodes of the graph represent actions of the plurality of actions.

12. The computer-implemented method of claim 11, wherein edges of the graph represent transitions between the actions.

* * * * *